US006636642B1

United States Patent
Yokose

(10) Patent No.: US 6,636,642 B1
(45) Date of Patent: Oct. 21, 2003

(54) IMAGE CODING DEVICE, IMAGE DECODING DEVICE, IMAGE CODING/DECODING DEVICE AND IMAGE CODING/DECODING METHOD

(75) Inventor: Taro Yokose, Nakai-machi (JP)

(73) Assignee: Fuji Xerox Co., Ltd., Tokyo (JP)

( * ) Notice: Subject to any disclaimer, the term of this patent is extended or adjusted under 35 U.S.C. 154(b) by 0 days.

(21) Appl. No.: 09/516,931

(22) Filed: Mar. 1, 2000

(30) Foreign Application Priority Data

Jun. 8, 1999 (JP) .......................................... 11-161620

(51) Int. Cl.[7] .............................. G06K 9/36; H04N 7/12; H04N 11/02; H04N 14/417; H03M 7/48
(52) U.S. Cl. ....................... 382/238; 382/239; 382/245; 375/240.14; 348/411.1; 341/63; 358/426.13
(58) Field of Search ................................. 382/245, 246, 382/238, 239; 375/240.02, 240.12, 240.14, 240.23; 348/409.1, 410.1, 411.1; 341/51, 59, 63, 67; 358/426.01, 426.13

(56) References Cited

U.S. PATENT DOCUMENTS

| | | | | | |
|---|---|---|---|---|---|
| 4,633,325 | A | * | 12/1986 | Usubuchi | 382/238 |
| 5,488,486 | A | * | 1/1996 | Shimizu | 358/451 |
| 5,828,789 | A | * | 10/1998 | Yokose et al. | 382/239 |
| 6,141,122 | A | * | 10/2000 | Ishimaru | 358/539 |
| 6,173,078 | B1 | * | 1/2001 | Kadono | 382/238 |
| 6,493,385 | B1 | * | 12/2002 | Sekiguchi et al. | 375/240.03 |

FOREIGN PATENT DOCUMENTS

JP          09-224253      *  8/1997

OTHER PUBLICATIONS

Abstract of US 5,138,673, Yoshida et al, Data Compression System, Aug. 11, 1992.*

* cited by examiner

Primary Examiner—Bhavesh M. Mehta
Assistant Examiner—Christopher Sukhaphadhana
(74) Attorney, Agent, or Firm—Morgan Lewis & Bockius LLP

(57) ABSTRACT

To realize image coding/decoding device that can compress an input multivalued image with high compression efficiency, the following measures are taken. First and second predictors predict the value of a target pixel based upon image data according to respective predetermined methods and respectively generate predicted value data. A run counter compares the image data and the predicted value data and if prediction hits and run continues to a pixel immediately before a count value of the run of the corresponding predictor is incremented by one. If there is no predictor the prediction of which hits and the runs of which continued to a pixel immediately before, the runs are sent to a selector together with the identification number of the predictor as run data. The selector selectively outputs a run value and an identification number or prediction error data from a prediction error calculator and outputs after the selector encodes it (them).

18 Claims, 22 Drawing Sheets

FIRST EMBODIMENT / IMAGE CODING DEVICE

FIRST EMBODIMENT / IMAGE DECODING DEVICE

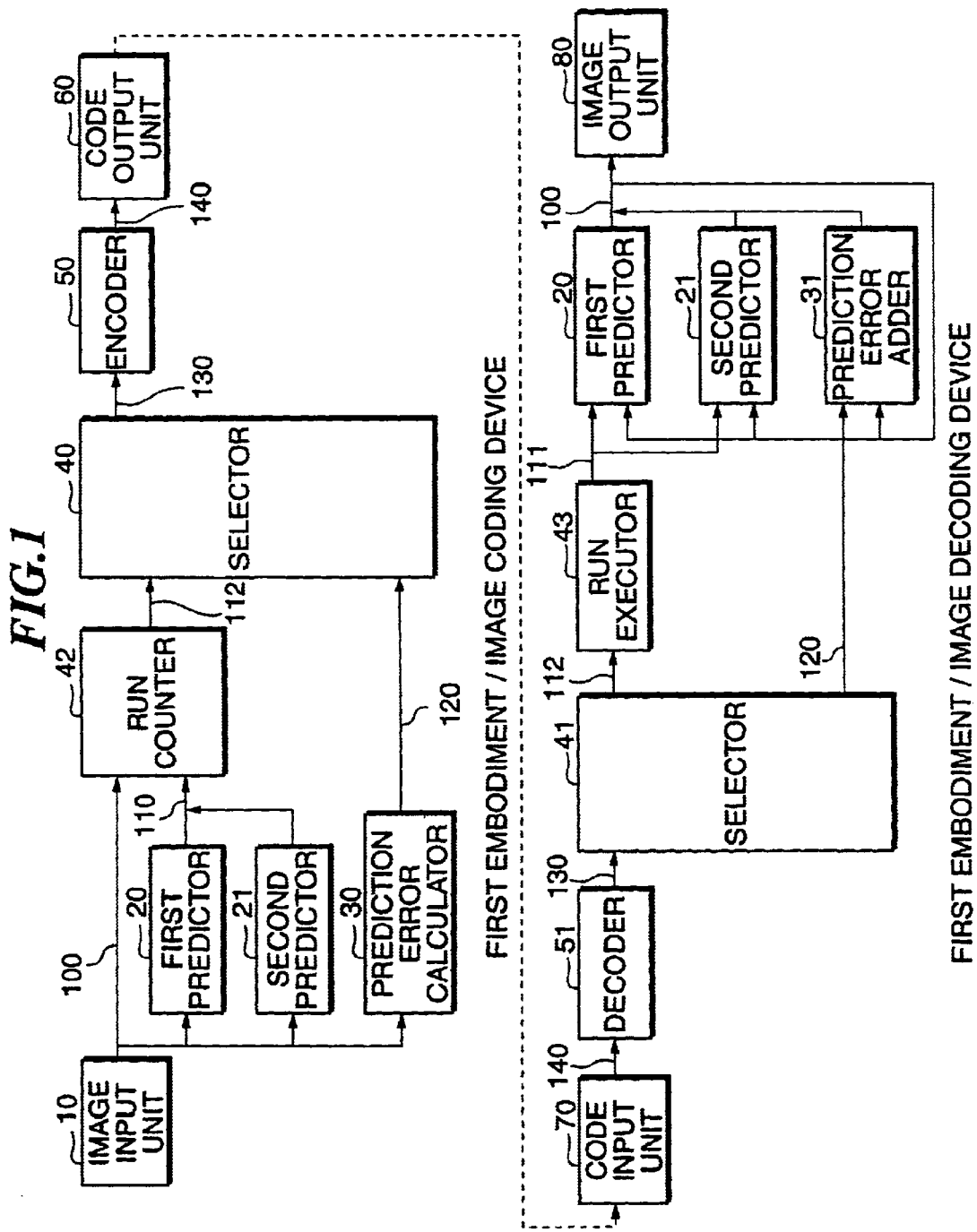

FLOWCHART OF S30 IN FIRST EMBODIMENT

FLOWCHART OF S130 IN FIRST EMBODIMENT

FIG.4A

|  | RUN COUNT VALUE | RUN CONTINUATION FLAG |
|---|---|---|
| FIRST PREDICTOR |  |  |
| SECOND PREDICTOR |  |  |

INTERNAL DATA FORMAT EXAMPLE OF RUN COUNTER 42

FIG.4B

|  | RUN COUNT VALUE | RUN CONTINUATION FLAG |
|---|---|---|
| FIRST PREDICTOR | 0 | CONTINUATION |
| SECOND PREDICTOR | 0 | CONTINUATION |

INITIAL STATE

FIG.4C

|  | RUN COUNT VALUE | RUN CONTINUATION FLAG |
|---|---|---|
| FIRST PREDICTOR | 3 | TERMINATION |
| SECOND PREDICTOR | 5 | CONTINUATION |

RUN EXAMPLE 1

FIG.4D

|  | RUN COUNT VALUE | RUN CONTINUATION FLAG |
|---|---|---|
| FIRST PREDICTOR | 3 | TERMINATION |
| SECOND PREDICTOR | 10 | TERMINATION |

RUN EXAMPLE 2

FIG.5A

| PREDICTOR ID NUMBER | RUN COUNT VALUE |

RUN DATA 112

FIG.5B

| PREDICTOR ID NUMBER | RUN COUNT VALUE |
| PREDICTION MISS ID NUMBER | PREDICTION ERROR VALUE |

PREDICTION RESULT DATA 130

FIG.5C

... | PREDICTION MISS ID NUMBER | PREDICTION ERROR VALUE | PREDICTOR ID NUMBER | RUN COUNT VALUE | PREDICTOR ID NUMBER | RUN COUNT VALUE | PREDICTION MISS ID NUMBER | PREDICTION ERROR VALUE | ...

CODE DATA 140

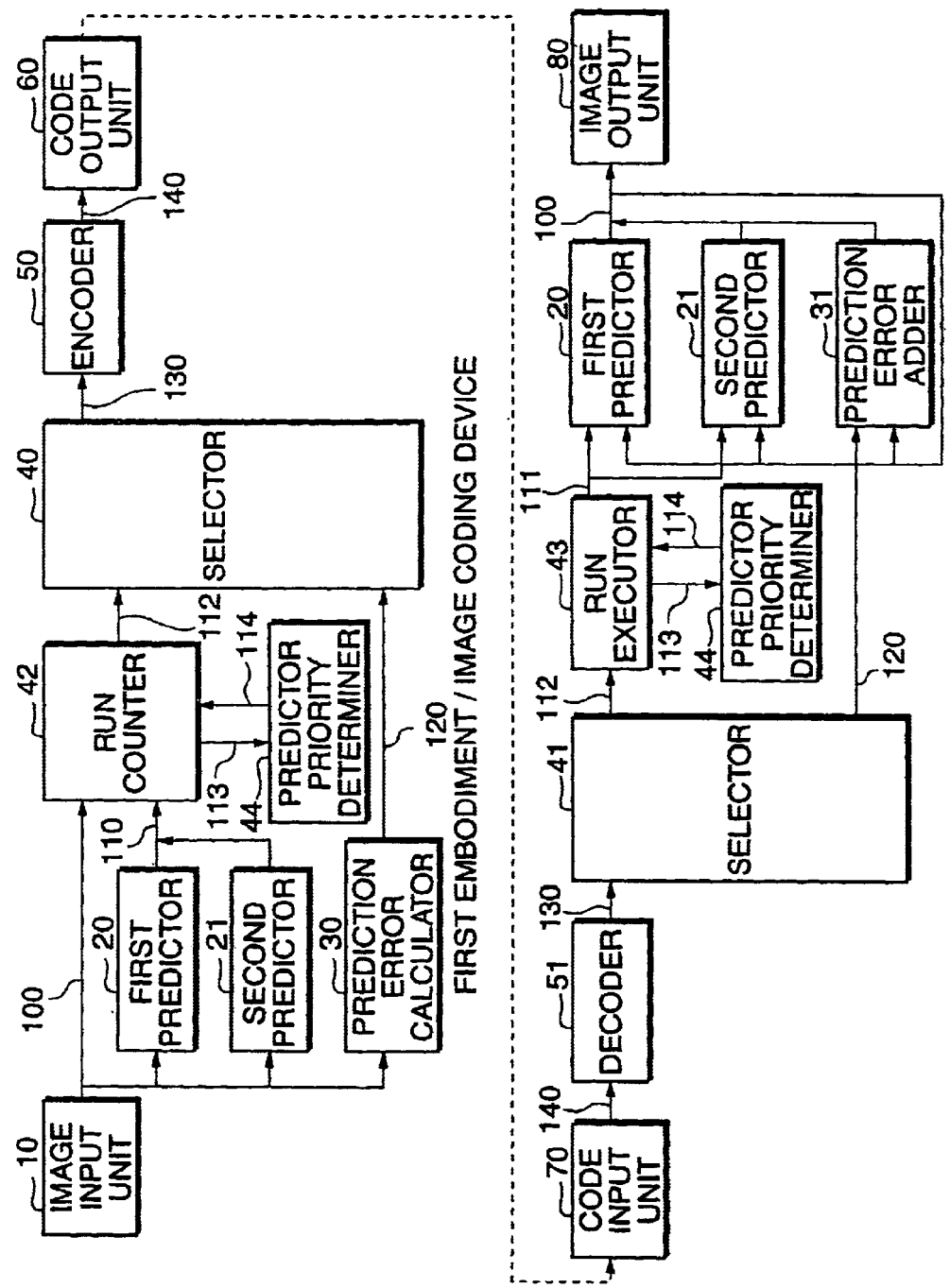

INITIAL VALUE

CASE WHERE RUNS OF PREDICTOR B ARE LONGEST

CASE WHERE RUNS OF PREDICTOR C ARE LONGEST

CASE WHERE RUNS OF PREDICTOR A ARE LONGEST

INITIAL VALUE

CASE WHERE RUNS OF PREDICTOR B ARE
LONGEST IMMEDIATELY BEFORE AND ARE EQUAL
TO UPPER LIMIT VALUE

CASE WHERE RUNS OF PREDICTOR B ARE
LONGEST IMMEDIATELY BEFORE AND ARE SHORTER
THAN UPPER LIMIT VALUE

FIG.10
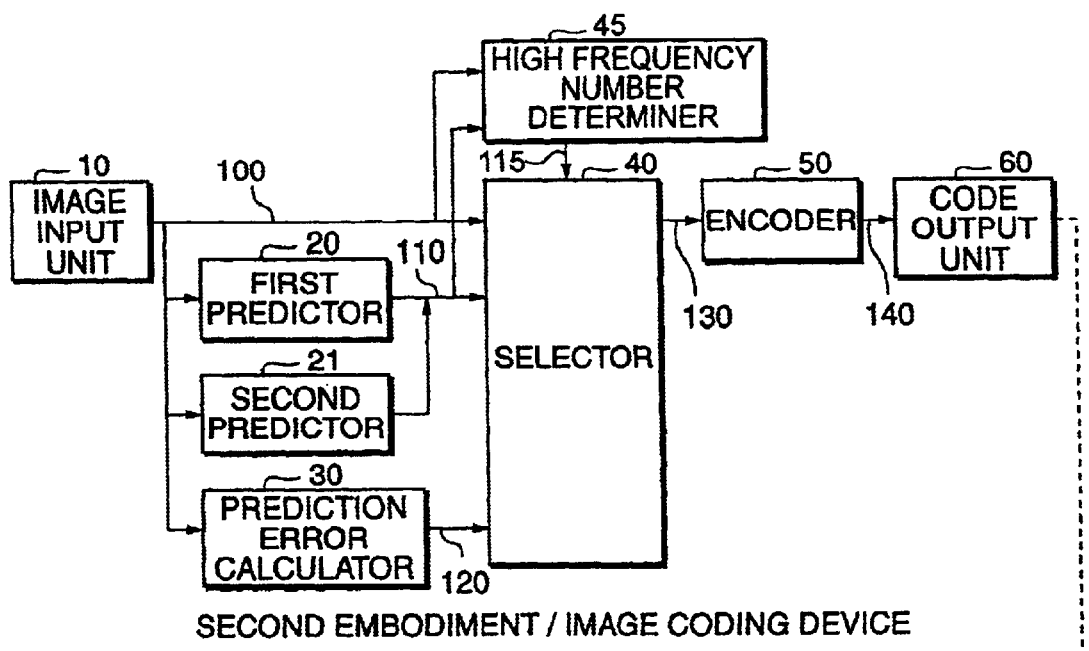
SECOND EMBODIMENT / IMAGE CODING DEVICE
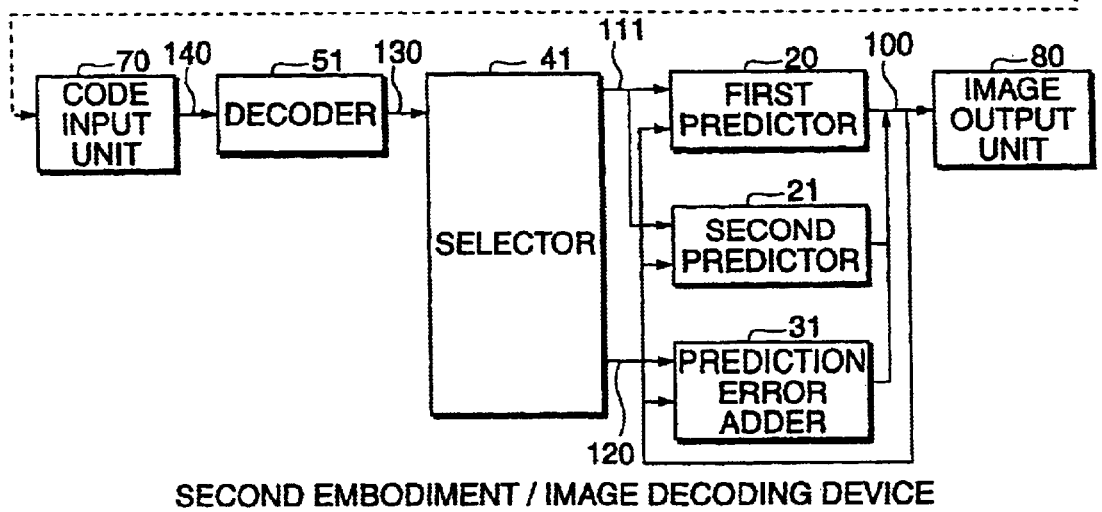
SECOND EMBODIMENT / IMAGE DECODING DEVICE

SECOND EMBODIMENT / CODING PROCEDURE

SECOND EMBODIMENT / DECODING PROCEDURE

FLOWCHART OF S31 IN SECOND EMBODIMENT

FLOWCHART OF S130 IN SECOND EMBODIMENT

FIG.15A

|  | FREQUENCY OF SUCCESS |
|---|---|
| FIRST PREDICTOR | 221 |
| SECOND PREDICTOR | 231 |

INTERNAL DATA FORMAT EXAMPLE EXAMPLE 1
OF HIGH FREQUENCY NUMBER DATA 115

FIG.15B

|  | FREQUENCY OF SUCCESS | HUFFMAN CODE |
|---|---|---|
| FIRST PREDICTOR | 221 | 10 |
| SECOND PREDICTOR | 231 | 0 |
| MISS OF PREDICTION | 120 | 11 |

EXAMPLE THAT CODE IS DESIGNED BASED UPON
HIGH FREQUENCY NUMBER DATA 115

FIG.15C

|  | FREQUENCY OF SUCCESS | | | |
|---|---|---|---|---|
|  | BOTH FIRST AND SECOND PREDICTORS SUCCEED IN LEFT-HAND NEXT PIXEL | ONLY FIRST PREDICTOR SUCCEEDS IN LEFT-HAND NEXT PIXEL | ONLY SECOND PREDICTOR SUCCEEDS IN LEFT-HAND NEXT PIXEL | NO RIGHT PREDICTOR IN LEFT-HAND NEXT PIXEL |
| FIRST PREDICTOR | 20 | 130 | 50 | 21 |
| SECOND PREDICTOR | 21 | 74 | 117 | 19 |

INTERNAL DATA FORMAT EXAMPLE 2 OF HIGH FREQUENCY
NUMBER DATA 115

FIG.15D

| | FREQUENCY OF SUCCESS |
|---|---|
| FIRST, SECOND, THIRD PREDICTORS SIMULTANEOUSLY SUCCEED | 4 |
| ONLY FIRST AND SECOND PREDICTORS SUCCEED | 190 |
| ONLY FIRST AND THIRD PREDICTORS SUCCEED | 20 |
| ONLY SECOND AND THIRD PREDICTORS SUCCEED | 21 |
| ONLY FIRST PREDICTOR SUCCEEDS | 7 |
| ONLY SECOND PREDICTOR SUCCEEDS | 16 |
| ONLY THIRD PREDICTOR SUCCEEDS | 13 |

INTERNAL DATA FORMAT EXAMPLE 3 OF HIGH FREQUENCY NUMBER DATA 115

FIG.16
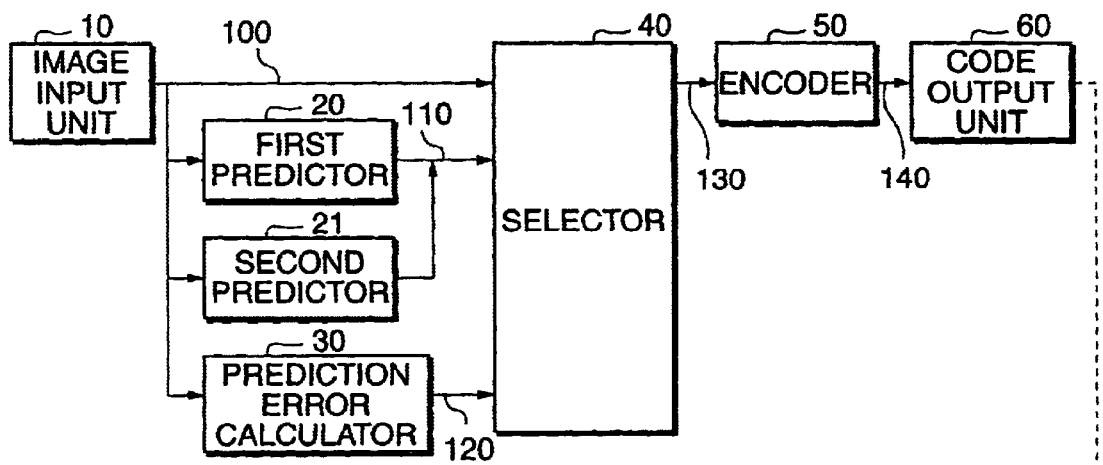
EXAMPLE OF PRIOR ART / IMAGE CODING DEVICE
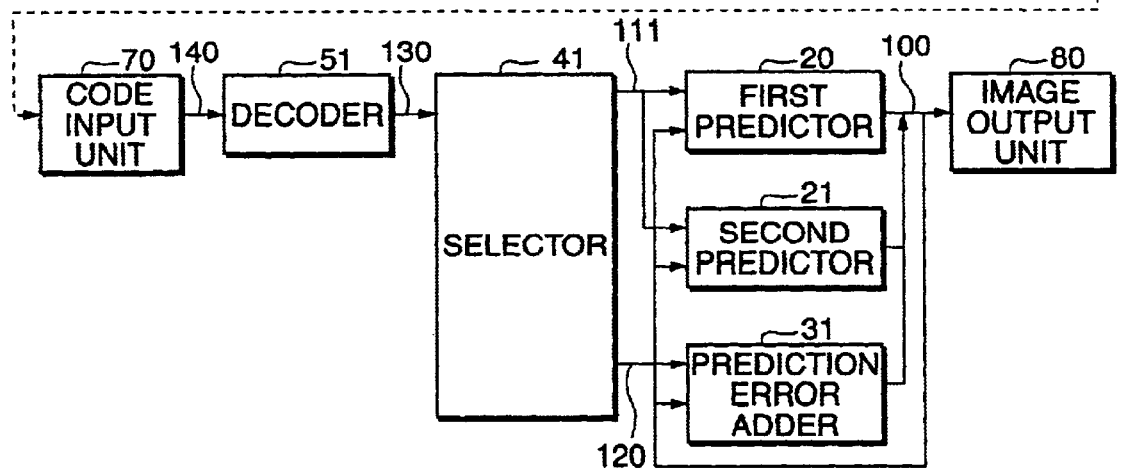
EXAMPLE OF PRIOR ART / IMAGE DECODING DEVICE

EXAMPLE OF PRIOR ART / CODING PROCEDURE

EXAMPLE OF PRIOR ART / DECODING PROCEDURE

EXAMPLE OF PREDICTORS

EXAMPLE OF INPUT IMAGE

FIG.19C (Prior Art)

| COORDINATES | | (0,0) | (1,0) | (2,0) | (3,0) | ... |
|---|---|---|---|---|---|---|
| PREDICTOR | A | SUCCESS | MISS | SUCCESS | MISS | ... |
| | B | MISS | MISS | SUCCESS | MISS | ... |
| | C | SUCCESS | SUCCESS | MISS | MISS | ... |
| | D | SUCCESS | SUCCESS | SUCCESS | SUCCESS | ... |
| OUTPUT IN EXAMPLE OF PRIOR ART | | FIRST PREDICTOR A | SECOND PREDICTOR C | THIRD PREDICTOR A | FOURTH PREDICTOR D | ... |

OUTPUT RESULT

FIG.19D (Prior Art)

| ID NUMBER | RUN | ID NUMBER | RUN | ID NUMBER | RUN | ID NUMBER | RUN |
|---|---|---|---|---|---|---|---|
| FIRST | 1 | THIRD | 1 | FIRST | 1 | FOURTH | 1 |

OUTPUT CODE

FIG.19E (Prior Art)

| ID NUMBER | RUN |
|---|---|
| FOURTH | 4 |

DESIRABLE CODE

IMAGE CODING DEVICE, IMAGE DECODING DEVICE, IMAGE CODING/ DECODING DEVICE AND IMAGE CODING/ DECODING METHOD

BACKGROUND OF THE INVENTION

1. Field of the Invention

The present invention relates to technology for compressing image data, particularly relates to lossless compression for a multivalued input image.

2. Description of the Related Art

As the quantity of image data is generally enormous, image data is often compressed to reduce the quantity in communication, storage and others. A method of compressing image data is roughly classified into two types of a lossless coding method and a lossy coding method. In the latter case, visual degradation may occur in a decoded image depending upon compression ratio.

Recently, for a typical image described in page description language (PDL), an image generated by a computer (hereinafter generically called a computer graphic (CG) image) increases. As these images include no noise component caused in scanning, the degradation of image quality by lossy coding is remarkable at an edge.

In lossy coding called a baseline process defined in a joint photographic coding experts group (JPEG) (refer to p. 160 to 182 of "Interface", December 1991 issue) which is a standard of image coding, after an image is converted to a frequency component using discrete cosine transform (DCT), it is quantized. JPEG is effective in a scanned image the energy of which concentrates on a low-frequency component. However, the degradation occurs in an image acquired by decoding a CG image including many high-frequency components. For an example of the degradation of image quality, mosquito noise caused in the vicinity of an edge and block noise caused between blocks can be given.

In the meantime, lossless coding, in which the same decoded image as an input image is acquired, can avoid the degradation of image quality. For an example of technology particularly related to a CG image in conventional type lossless coding, proposal disclosed in Japanese published unexamined patent application No. Hei 9-224253 will be described below. The above conventional type utilizes the characteristics of a CG image that a prediction based upon neighbor pixels often hit and uses a hit one of plural predictions as a code.

Conventional type image coding device and image decoding device are respectively shown in upper and lower halves in FIG. 16. As shown in FIG. 16, a reference number 10 denotes an image input unit, 20 denotes a first predictor, 21 denotes a second predictor, 30 denotes a prediction error calculator, 31 denotes a prediction error adder, 40 and 41 denote a selector, 50 denotes an encoder, 51 denotes a decoder, 60 denotes a code output unit, 70 denotes a code input unit, 80 denotes an image output unit, 100 denotes image data, 110 denotes prediction value data, 111 denotes control data, 120 denotes prediction error data, 130 denotes prediction result data and 140 denotes code data.

Each unit shown in FIG. 16 will be described below. The image coding device shown in the upper half in FIG. 16 is made up as follows. The image input unit 10 receives an image input from an external device and respectively sends it to the first and second predictors 20 and 21 and the prediction error calculator 30 as image data 100. The first and second predictors 20 and 21 predict the value of a target pixel based upon the image data 100 according to respective predetermined methods and send it to the selector 40 as predicted value data 110. The prediction error calculator 30 predicts the value of the target pixel based upon the image data 100 according to a predetermined method, subtracts the predicted value from the actual value of the target pixel and sends the value to the selector 40 as prediction error data 120. The selector 40 detects based upon the image data 100 and the predicted value data 110 whether the prediction is coincident at the target pixel or not. If there is one or more hit predictors, the selector converts the identification number of the hit predictor to prediction result data 130 and sends it to the encoder 50. If not, the prediction error data 120. The encoder 50 encodes the prediction result data 130 using a predetermined entropy coding method and sends it to the code output unit 60 as code data 140. The code output unit 60 outputs the code data 140 to an external device as an output code.

Next, each unit of the image decoding device shown in the lower half in FIG. 16 will be described. The same number is allocated to the same each unit as that in the image coding device and the description is omitted. The code input unit 70 receives a code input from an external device and sends it to the decoder 51 as code data 140. The decoder 51 decodes the code data 140 according to a decoding method corresponding to the coding method used in the encoder 60 and sends it to the selector 41 as prediction result data 130. The selector 41 sends control data 111 to the corresponding predictor if the prediction result data 130 represents the identification number of the predictor and instructs the predictor to output image data 100. The selector also sends the prediction error data 120 to the prediction error adder 31 if the contents of the prediction result data 130 show an error. The prediction error adder 31 predicts the value of a target pixel according to the same method as that of the prediction error calculator 30, adds the prediction error data 120 to the predicted value and sends it to the image output unit 80 as image data 100. The image output unit 80 outputs the image data 100 to an external device to as an output image.

The operation based upon the above configuration will be described below. FIGS. 17 and 18 are flowcharts showing the operation of conventional type image coding/decoding device. The operation of the conventional type will be described below.

First, referring to FIG. 17, coding processing will be described. In S10, the image input unit 10 inputs an image. In S20, the first and second predictors 20 and 21 predict the value of a target pixel based upon image data 100 and simultaneously, the prediction error calculator 30 calculates an error of a predicted value according to a predetermined method. In S30, the selector 40 sends the identification number of the hit predictor or a prediction error to the encoder 50 as prediction result data 130. In S50, the encoder 50 applies predetermined coding to the prediction result data 130. In S60, if input image data is finished, coding processing is terminated and if not, the processing proceeds to S10.

Next, decoding processing will be described referring to FIG. 18. In S110, the code input unit 70 inputs a code. In S120, the decoder 51 executes decoding processing which is equivalent to processing reverse to coding processing executed by the encoder 50 and generates prediction result data 130. In S130, the selector 41 sends control data 111 to either of the first or second predictor 20 or 21 having the following identification number when the prediction result data 130 represents the identification number of the predictor. If the prediction result data 130 represents a prediction error, the selector 41 also sends the prediction error to the prediction error adder 31 as prediction error data 120. In S21, if there is one or more hit prediction, either of the first or second predictor 20 or 21 which receives the control data 111 executes predetermined prediction and generates image data 100. If there is not, the prediction error adder 31 adds prediction error data 120 to a predicted value acquired by the similar prediction to the prediction error calculator 30 and generates image data 100. In S140, the image output unit 80 outputs the image data 100 to an external device. In S150, when input code data is finished, decoding processing is terminated and if not, the processing proceeds to S110.

Of the above operation, the selection of the predictor in S30 is performed according to a predetermined priority or suited one as the rank order of the predictors in a second embodiment of the above Japanese published unexamined patent application No. Hei 9-224253. Also, for an example of the encoder 50, run length coding applied to the identification number of the first predictor 20 is described.

Next, the problem of the conventional type will be described. In prior art, priority is given to the selection of the predictor fixedly or suitably. In any case, as the predictors are related in precedence order, the above order is generically called priority. According to prior art, as priority is known before prediction, the processing can be efficiently executed if the predictor having higher priority executes ahead. For example, in the case of sequential processing by software, efficient processing is also enabled. Conversely, if priority is not suitable, the quantity of codes may be increased. An example of the above will be given below.

An example that fixed priority is used and run length coding is executed as an encoder is given. In this case, as runs are generally longer when the selection of a predictor is repeated, the quantity of codes is reduced.

FIG. 19A to E are explanatory drawings showing the operation of the conventional type. Suppose that there are four predictors shown in FIG. 19A. Also, suppose that an image shown in FIG. 19B is input. For simplification, suppose that the input image is a binary image including blank pixels and hatched pixels. Suppose that a pixel equivalent to (x, y)=(0, 0) shown in FIG. 19 is first coded.

FIG. 19C shows the result of output in the conventional type. In a field described as the predictor, the result of predictions is shown. Further, a field at the bottom end shows the output result of the conventional type. In this example, fixed priority is given in the order of a first predictor, a second predictor, a third predictor and a fourth predictor. As run length coding is applied to the output result, output code is as shown in FIG. 19D.

FIG. 19C shows that the predictor D hits on all coordinates. Therefore, in the case of a code shown in FIG. 19E, the quantity of codes can be much reduced. As a result, in the example of prior art, it is known that optimum coding is not executed.

The above problem is caused by mismatch between the priority and the continuity of prediction hit in the conventional type. That is, the fourth predictor which continuously hits in the example shown in FIGS. 19A to E has the lowest priority. A fact that a specific predictor frequently hits before and a fact that the specific predictor continuously hits at the certain time correlate, however, are not necessarily coincident. As only the former has an effect upon priority at this time, the above mismatch may occur.

The above problem is described under supposition that run length coding is applied, however, can be generalized. The more general description of the above problem is that the selection of a predictor is based upon priority for the convenience and selection that enables to reduce the quantity of codes in later coding is not performed.

As described above, the problem of the conventional type is that a predictor is selected based upon the priority, the quantity of codes may be increased, compared with the original quantity of information.

SUMMARY OF THE INVENTION

The present invention has been made in view of the above situation and provides a lossless image coding device which can acquire high compression efficiency.

According to an aspect of the present invention, as shown in FIG. 1, the image coding device is provided with an image input part that inputs an image, plural pixel value predictors that predict the value of a target pixel to be coded in the image input by the image input part according to the respective different prediction methods, a prediction error calculator that calculates an error between the actual value of the target pixel in the image input by the above image input part and the predicted value according to the predetermined prediction method, a run counter that judges whether or not the pixel values respectively predicted by the plural pixel value predictors and the value of the target pixel are coincident and counts runs equivalent to the continuous length of coincidences, a selector that selectively outputs either the identification information for identifying the pixel value predictor and the length of its runs or an error calculated by the above prediction error calculator, an encoder that encodes either the identification information and the run length or the error respectively output by the selector according to a predetermined method and an output part that outputs a code encoded by the above encoder. When the run of all pixel value predictors is finished, if there is a run that continued till immediately before and its length is at least 1, the selector outputs the corresponding identification information and its run length, and the run counter initializes holding values. If there is at least one pixel value predictor, in which the predicted value and the value of the target pixel are coincident at that time, the run counter newly starts counting. If there is no such predictor, the selector outputs the error.

According to the above configuration, as a pixel value predictor is selected so that run length is longer, compression ratio can be enhanced.

According to another aspect of the present invention, as shown in FIG. 1 also, an image decoding device is provided with a code input part that inputs a code generated by the above image coding device, a decoder that decodes the code input by the above code input part according to a predetermined method, a selector that selects either of a run executor described later or an prediction error adder based upon information decoded by the above decoder, the run executor that selects one of plural pixel value predictors described later by a frequency equivalent to run length based upon the identification information and run length decoded by the above decoder, the plural pixel value predictors that predict the value of a target pixel according to the respective different methods, a prediction error adder that calculates the value of the target pixel by adding an error decoded by the above decoder to a value predicted by the predetermined method and an image output part, if any of the above pixel value predictors is selected by the above selector and the above run executor, that outputs the value calculated by the selected pixel value predictor, and if not, outputs the value of the target pixel calculated by the prediction error adder.

According to the above configuration, an image coded by above image coding device can be decoded.

According to another aspect of the present invention, an image coding/decoding device includes the above image coding device and the above image decoding device.

According to another aspect of the present invention, as shown in FIG. 10, an image coding device is provided with an image input part that inputs an image, plural pixel value predictors that predict the value of a target pixel to be coded in the image input by the above image input part according to the respective different methods, a prediction error calculator that calculates an error between the value of the target pixel in the image input by the above image input part and a value predicted according to a predetermined method, a high frequency number determiner that judges whether or not each pixel value predicted by the above plural pixel value predictors and the value of the target pixel are coincident and counts the frequency of the coincidence, a selector that judges whether or not each pixel value predicted by the above plural pixel value predictors and the value of the target pixel are coincident and selectively outputs identification information of the above pixel value predictor if coincident and the error calculated by the above prediction error calculator if not, an encoder that encodes the identification information or the error respectively output by the above selector according to a predetermined method and an output part that outputs a code encoded by the above encoder, the frequency of hit predicts is counted by the above high frequency number determiner in first processing and the pixel value predictor is selected based upon high frequency number information determined by the above high frequency number determiner in second processing.

According to another aspect of the present invention, in an image coding method, an image is input, the value of a target pixel to be coded in the image is predicted according to plural different methods, it is judged whether or not each predicted value and the value of the target pixel are coincident or not, if coincidence continues runs are counted for every prediction method equivalent to the coincidence continuous length, when the run of all pixel value predictors is finished, if the length of the longest run that continued till immediately before equals to zero, an error between the actual value of the target pixel and a value predicted according to a predetermined method is coded, and if not, the run length and identification information of the predictor are encoded, a count value of the above runs is initialized, and if at least one of predicted values and the value of the target pixel are coincident, a run count is newly started.

According to another aspect of the present invention, in an image decoding method, a code is input, the above code is decoded according to a predetermined method, it is selected based upon the above decoded information whether a run is to be executed or a prediction error is to be added, if a run is executed, a pixel value is generated by certain prediction method by a frequency based upon decoded identification information and decoded run length, and if not, a pixel value is generated by adding a predicted value according to a predetermined method to a decoded error.

As described above, in the present invention, an image is input, the value of a target pixel to be coded in the input image is predicted according to respective different methods, an error between the actual value of the target pixel and a value predicted according to a predetermined method is calculated, it is judged whether or not the predicted value and the actual value are coincident, if coincident the corresponding identification information or corresponding information and if not the above error is selectively selected, the selected identification information and others or the selected error is encoded according to a predetermined method and further, if there are plural identification information to be selected, the candidates are selected so that the coding of the corresponding predetermined method or the coding of the whole is optimized. The characteristics of not only the priority of prediction but total information are considered by the above method and efficient compression is enabled.

BRIEF DESCRIPTION OF THE DRAWINGS

Preferred embodiments of the invention will be described in detail based on the followings, wherein:

FIG. 1 is a block diagram showing a first embodiment of image coding/decoding device according to the present invention;

FIGS. 4A to 4D are explanatory drawings for explaining run counting processing in the first embodiment of the image coding/decoding device according to the present invention;

FIGS. 5A to 5C are explanatory drawings for explaining the concept of each data piece in the first embodiment of the image coding/decoding device according to the present invention;

FIG. 6 is a block diagram showing a transformed example of the first embodiment of the image coding/decoding device according to the present invention;

FIG. 10 is a block diagram showing a second embodiment of the image coding/decoding device according to the present invention;

FIGS. 15A to 15D are explanatory drawings for explaining high frequency number data in the second embodiment of the image coding/decoding device according to the present invention;

FIG. 16 is a block diagram showing conventional type image coding/decoding device;

FIGS. 19A to 19E are explanatory drawings for explaining the operation of the conventional type image coding/decoding device.

DETAILED DESCRIPTION OF THE PREFERRED EMBODIMENTS

Figure 2A:
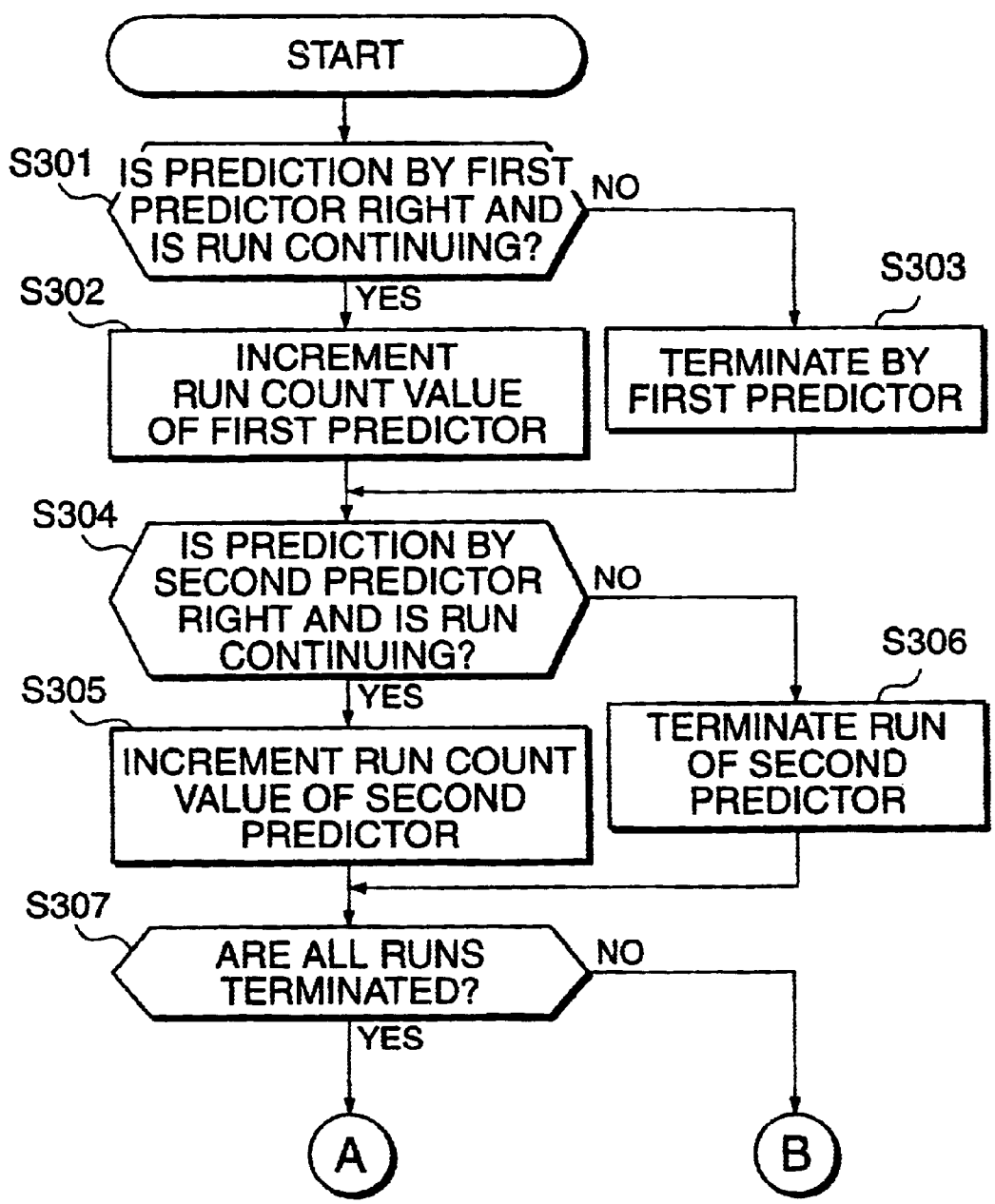
FIGS. 2A and 2B are flowcharts showing an example of the details (different from those in prior art) of coding operation in the first embodiment of the image coding/decoding device according to the present invention.

Embodiments of the present invention will be described in detail below.

First, before the concrete description of the embodiments of the present invention, the basic principle of the present invention will be described. The problem of a conventional type is that priority is given to plural predictors and a predictor is selected based upon only the priority. What determines the quantity of codes is the quantity of information included in the identification number string output by the selector. Thus, it is desirable to perform selection which reduces the quantity of the information.

If run length coding is executed after the selector, selection should be performed so that runs continue as long as possible. If the identification number of a predictor is individually coded in place of a run, selection has only to be performed so that the entropy of an occurrence of the identification number is as low as possible, that is, so that frequency distribution is biased.

However, in this case, as all predictors should be executed, the quantity of processing is generally slightly increased, compared with a conventional type in which processing may be finished by only predictors with higher priority.

For the embodiments of the present invention, the following two cases of the identification number of a predictor will be described below.

(1) A case where run length coding is executed (2) A case where the identification number of a predictor is individually coded in place of a run First Embodiment For a first embodiment of the present invention, a case where run length coding is executed according to the present invention will be concretely described below. FIG. 1 is a block diagram showing the first embodiment of the present invention. In FIG. 1, the same reference number is allocated to the similar part to that in FIG. 16 and the description is omitted. A reference number 42 denotes a run counter, 43 denotes a run executor and 112 is run data.

Next, each unit shown in FIG. 1 will be described. The run counter 42 compares image data 100 and predicted value data 110. If the prediction hits and the run continues to a pixel immediately before, the run count value of the corresponding predictor is incremented by one. If there is no predictor which hits and the runs of which continued to a pixel immediately before, the run which continued to the pixel immediately before are sent to a selector 40 together with the identification number of the corresponding predictor as run data 112. The run executor 43 sends a control signal 111 to a specified predictor by the frequency of runs based upon the run data 112 input from a selector 41.

Figure 2B:
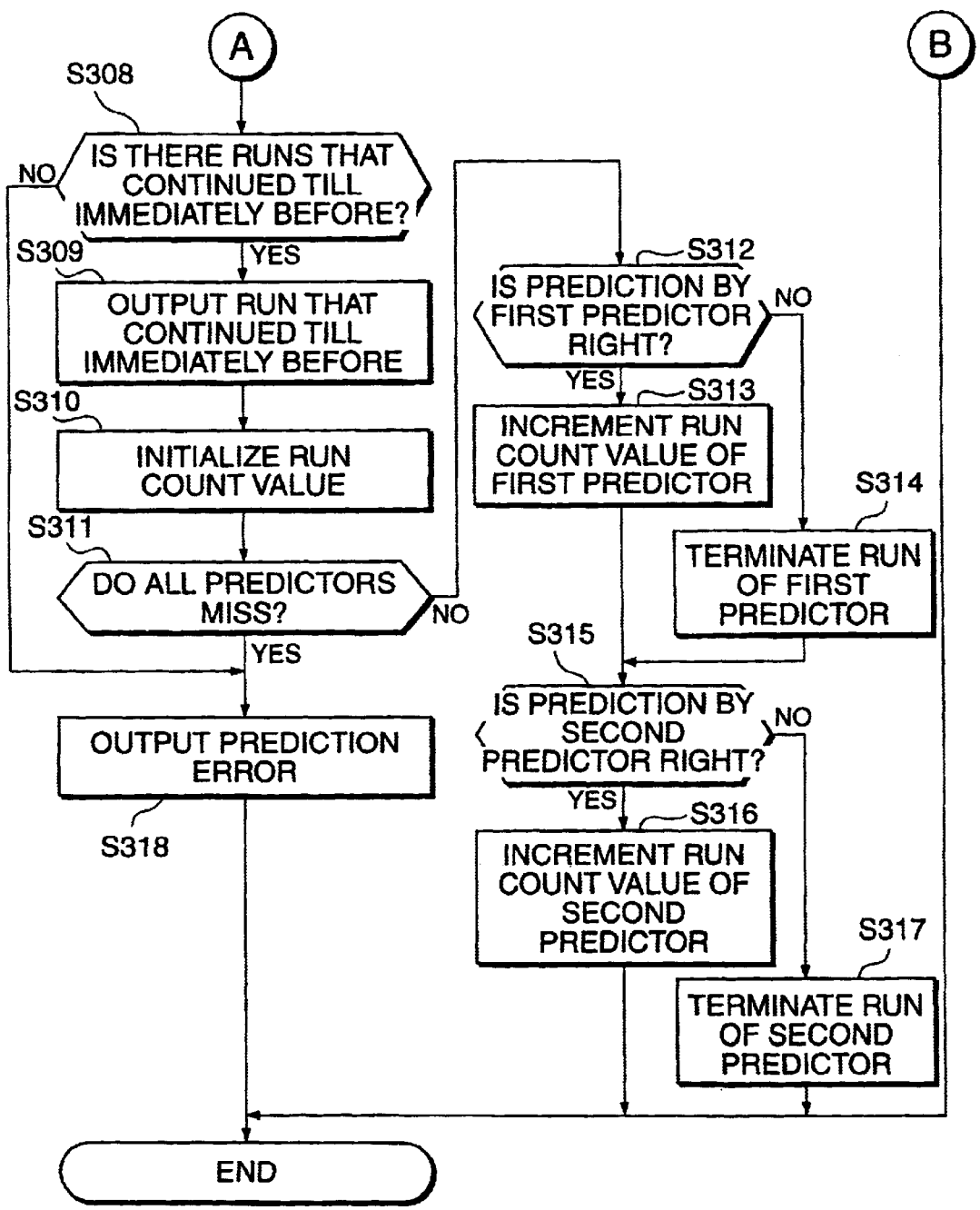
Figure 3:
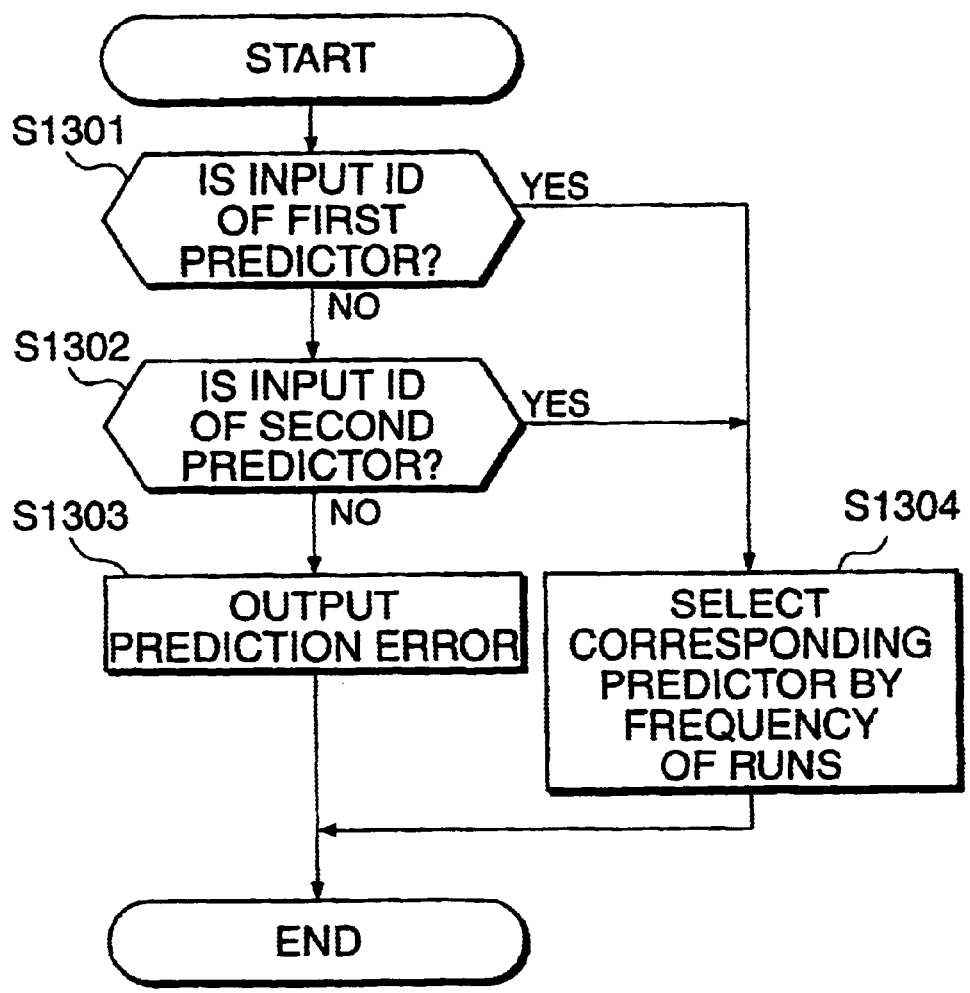
FIG. 3 is a flowchart showing an example of the details (different from those in prior art) of decoding operation in the first embodiment of the image coding/decoding device according to the present invention.

The operation of the first embodiment based upon the above configuration will be described below. FIGS. 2 and 3 are flowcharts respectively showing a part of the operation of the first embodiment.

Figure 17:
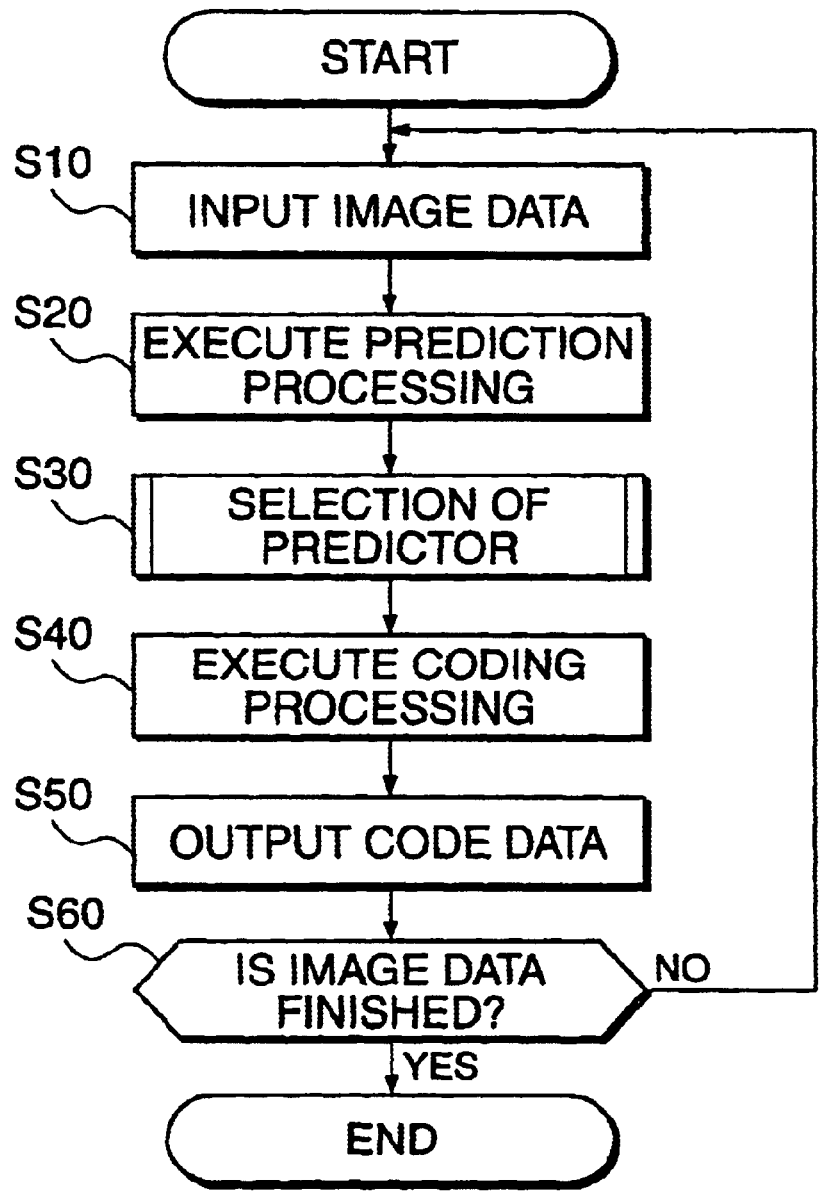
FIG. 17 is a flowchart showing an example of the coding operation of the conventional type image coding/decoding device.
Figure 18:
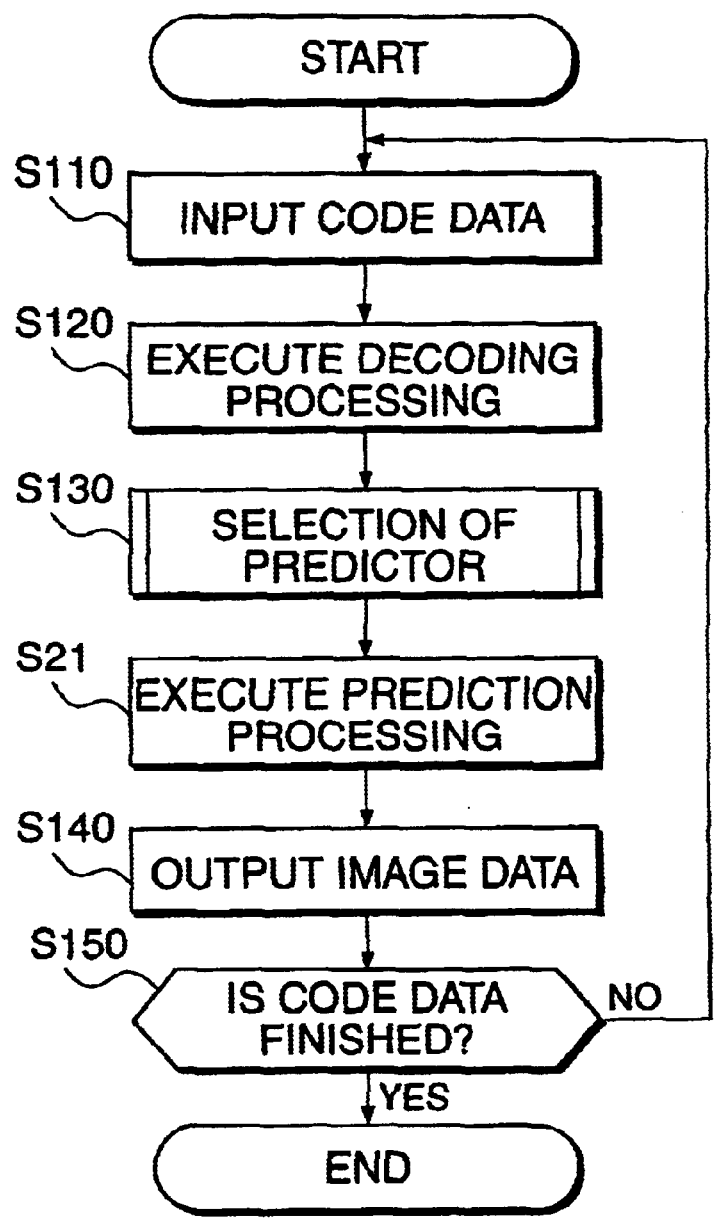
FIG. 18 is a flowchart showing an example of the decoding operation of the conventional type image coding/decoding device.
Figures 19A, 19B:
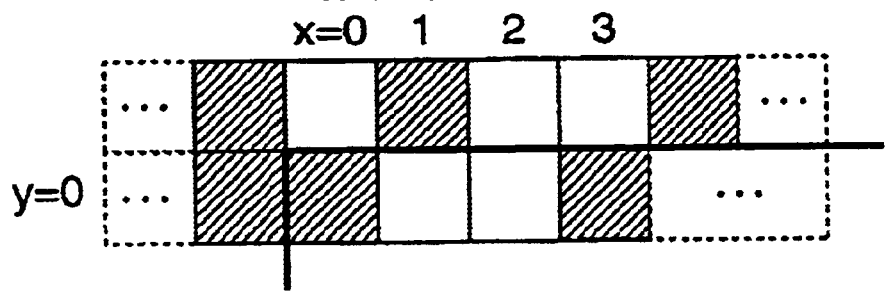

Referring to FIGS. 2 and 3 (also refer to FIGS. 17 and 18), the processing procedure of the first embodiment will be described below. For the operation related to FIGS. 17 and 18, as it is similar to that in the conventional type, the description is omitted and respectively referring to FIGS. 2 and 3, S30 in FIG. 17 and S130 in FIG. 18 will be described.

First, referring to FIG. 2, S30 will be described. In S301, the run counter 42 determines whether or not predicted value data 110 by a first predictor 20 and image data 100 are coincident, if the prediction hits and run continues to a pixel immediately before, the processing proceeds to S302 and if not, the processing proceeds to S303. In S302, the run counter 42 increments the run count value of the first predictor by one. In S303, the run counter 42 terminates the run of the first predictor with the run count value as it is. In S304, the run counter 42 determines whether or not predicted value data 110 by a second predictor 21 and image data 100 are coincident, if the prediction hits and run continues to a pixel immediately before, the processing proceeds to S305 and if not, the processing proceeds to S306. In S305, the run counter 42 increments the run count value of the second predictor by one. In S306, the run counter 42 terminates the run of the second predictor with the run count value as it is. In S307, if there is no run continues, the processing proceeds to S308 and if there is even one, the run counter terminates S30.

In S308, it is determined whether there are runs which continued to a pixel immediately before or not, and if any, the processing proceeds to S309, if not, the processing proceeds to S318. In S309, the selector 40 selects run data 112, which includes the run length which continued to the pixel immediately before and the identification number of the corresponding predictor, and sends it to the encoder 50 as prediction result data 130. In S310, the run counter 42 initializes all run count values. In S311, if there is at least one hit predictor, the processing proceeds to S312 and if not, the processing proceeds to S318. In S312, the run counter 42 determines whether predicted value data 110 by the first predictor 20 and image data 100 are coincident or not. If the prediction hits, the processing proceeds to S313 and if not, the processing proceeds to S314. In S313, the run counter 42 increments the run count value of the first predictor by one. In S314, the run counter 42 terminates the run of the first predictor with the run count value as it is. In S315, the run counter 42 determines whether predicted value data 110 by the second predictor 21 and image data 100 are coincident or not. If the prediction hits, the processing proceeds to S316 and if not, the processing proceeds to S317. In S316, the run counter 42 increments the run count value of the second predictor by one. In S317, the run counter 42 terminates the run of the second predictor with the run count value as it is. In S318, the selector 40 selects prediction error data 120 and sends it to the encoder as prediction result data 130.

Next, referring to FIG. 3, S130 will be described. In S1301, if the identification number of the first predictor is input to the selector 41, run data 112 is sent to the run executor 43 and the processing proceeds to S1304. In S1302, if the identification number of the second predictor is input to the selector 41, run data 112 is sent to the run executor 43 and the processing proceeds to S1304. In S1303, the selector 41 sends prediction error data 120 to the prediction error adder 31. In S1304, the run executor 43 sends control data 111 to the corresponding predictor by the frequency of run length specified in the run data 112.

In the above operation, when a prediction is wrong in a run corresponding to each predictor even once, the run is terminated.

The two predictors are described above, however, three or more predictors may also be provided. As the description can be easily guessed, it is omitted.

If there are plural runs which continued till immediately before when all runs are terminated, a predictor is selected according to predetermined priority. The above priority may also be fixed as in the conventional type, may also be adaptive rank order based upon statistical processing and others.

For convenience of explanation, each run is described as if it had no upper limit value, however, in actual device, if the upper limit value of a run is not set, design is difficult. If such an upper limit value is considered, the judgment of whether a run reaches its upper limit value or not in branching processing in S307 shown in FIG. 2 has only to be added. As it can be easily guessed, the detailed description is omitted.

Also, for convenience of explanation, it is explained as if the runs of each predictor were sequentially counted, however, if actual device is configured so that parallel operation is enabled, predictions and counting runs may also be simultaneously executed in respective predictors.

FIGS. 4A to D are conceptual drawings showing the internal data of the run counter 42. FIG. 4A shows an example of an internal format. In this example, the count value of runs is stored in the field of a run count value and in the field of a run continuation flag, the continuation of runs or the termination is stored. The operation of the internal format example will be described below. FIG. 4B shows an initial state. In FIG. 4B, the run count value of both predictors is initialized to zero and a run continuation flag is set to continuation. FIGS. 4C and 4D show examples during execution. FIG. 4C shows that the runs of the second predictor continue, however, the first predictor is already terminated when three runs continue. FIG. 4D shows that the second predictor is first in a wrong state and finally, the run of the second predictors continues by ten. As all runs are terminated, initialization is executed immediately after. This state is equivalent to the procedure in S310 shown in FIG. 2.

FIG. 5 shown next are conceptual drawings showing each data. FIG. 5A is a conceptual drawing showing run data 112. As shown in FIG. 5A, the run data 112 necessarily includes a set of a predictor identification number and a run count value. FIG. 5B is a conceptual drawing showing prediction result data 130. The prediction result data 130 functions as similar information to the run data 112 in case any of the predictors is selected and if a prediction error is selected, the prediction result data includes a set of the identification number of prediction miss and a prediction error value. FIG. 5C is a conceptual drawing showing code data 140. The code data 140 is one stream in which the prediction result data 130 are mixed and as a data format, is converted to a code string by the encoder 50.

A transformed example of this embodiment will be described below. It is already described that this embodiment is acquired by improving the first example of the conventional type. The transformed example that priority which is the rank order of each predictor is given to each predictor is described as the second example of the conventional type, however, this embodiment can be also similarly applied to these examples. FIG. 6 is a block diagram showing a transformed example of this embodiment. In FIG. 6, the same reference number is allocated to the similar part to that in FIG. 1 and the description is omitted. A reference number 44 denotes a predictor priority determiner, 113 denotes prediction result data and 114 denotes predictor priority data.

Each unit shown in FIG. 6 will be described below. The predictor priority determiner 44 determines the priority of each predictor based upon prediction result data 113 and sends it to the run counter 42 or the run executor 43 as predictor priority data 114. The transformed example is different from the first embodiment in that the run counter 42 counts runs every priority of the predictor though the run counter counts runs every identification number of the predictor in the first embodiment and the priority is output as run data 112 in place of an identification number. Also the transformed example is different from the first embodiment in that the run executor 43 executes runs in the corresponding priority, in place of runs based upon the corresponding identification number in the first embodiment, and converts it to the corresponding identification number.

As the description of the operation can be easily guessed based upon the operation of the conventional type and in the first embodiment, it is omitted.

Of the above operation, the priority determined by the predictor priority determiner 44 based upon a hit frequency, the absolute value of a prediction error, the mean or the variance of the square of prediction errors, an interval since a prediction finally hits and others. The priority is updated for every pixel which is the smallest unit, however, for the simplification of processing, it may also be updated at a suitable interval, for example, for every line.

Figure 7A:
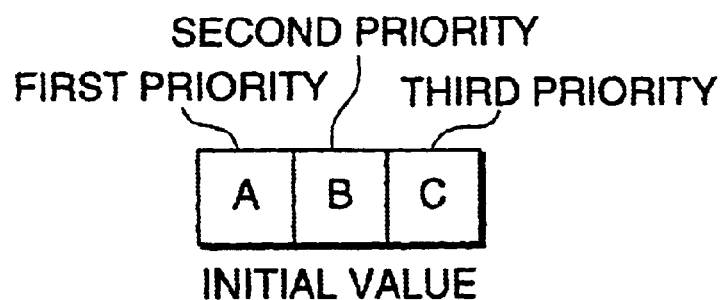
FIGS. 7A to 7D are explanatory drawings showing examples of a method of updating the priority of predictors in the first embodiment of the image coding/decoding device according to the present invention.
Figure 7B:
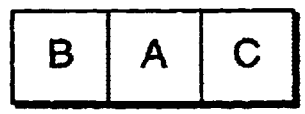
Figure 7C:
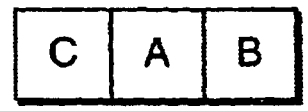
Figure 7D:
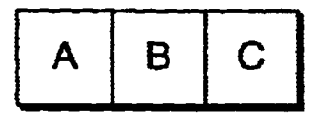

An example of a method of updating the priority based upon an interval since a prediction finally hits will be described below. FIG. 7 are its explanatory drawings. In this case, the priority has only to be updated with the hit predictor immediately before as a first priority. For example, suppose that three predictors A, B and C are provided and the initial priority is the order of A, B and C as shown in FIG. 7A. If the run of the predictor B are the longest, priority becomes the order of B, A and C as shown in FIG. 7B. If the run of the predictor C are the longest, priority becomes the order of C, A and B as shown in FIG. 7C. If the run of the predictor A are the longest, priority stays the order of A, B and C as they are as shown in FIG. 7D.

Next, a case where such an updating method as described is used and the upper limit value of runs is restricted will be considered. In this case, if the selected run doesn't reaches the upper limit value, the predictor used there is not selected next. Nevertheless, in the priority updating method, the predictor which should not be selected next is updated as a first priority, thus the efficiency of coding lowers.

Figure 8A:
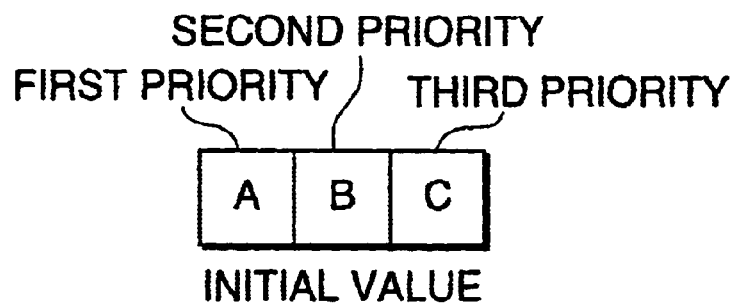
FIGS. 8A to 8C are explanatory drawings showing improved examples of the method of updating the priority of predictors in the first embodiment of the image coding/decoding device according to the present invention.
Figure 8B:
Figure 8C:

In such a case, the priority may also be temporarily shifted. That is, unless runs reach the upper limit value, a priority is shifted by one such as a second priority is temporarily shifted as a first priority, a third priority is temporarily shifted as a second priority and so on. After coding is finished, the temporary priority is restored to the original one and updating is performed. FIGS. 8A to C show the above situation. The efficiency of coding can be enhanced by the above processing. A flowchart showing the operation is omitted.

There are some cases where another conversion of the priority is effective. For example, if predictors in first and second priorities of three predictors show the same predicted values and runs, the predictor in the second priority cannot be selected. Thus shift from the third priority to the second one is effective to enhance the compression ratio. Generally speaking together with the former example, the priority of predictors except predictors which cannot be selected has only to be performed.

Figure 9:
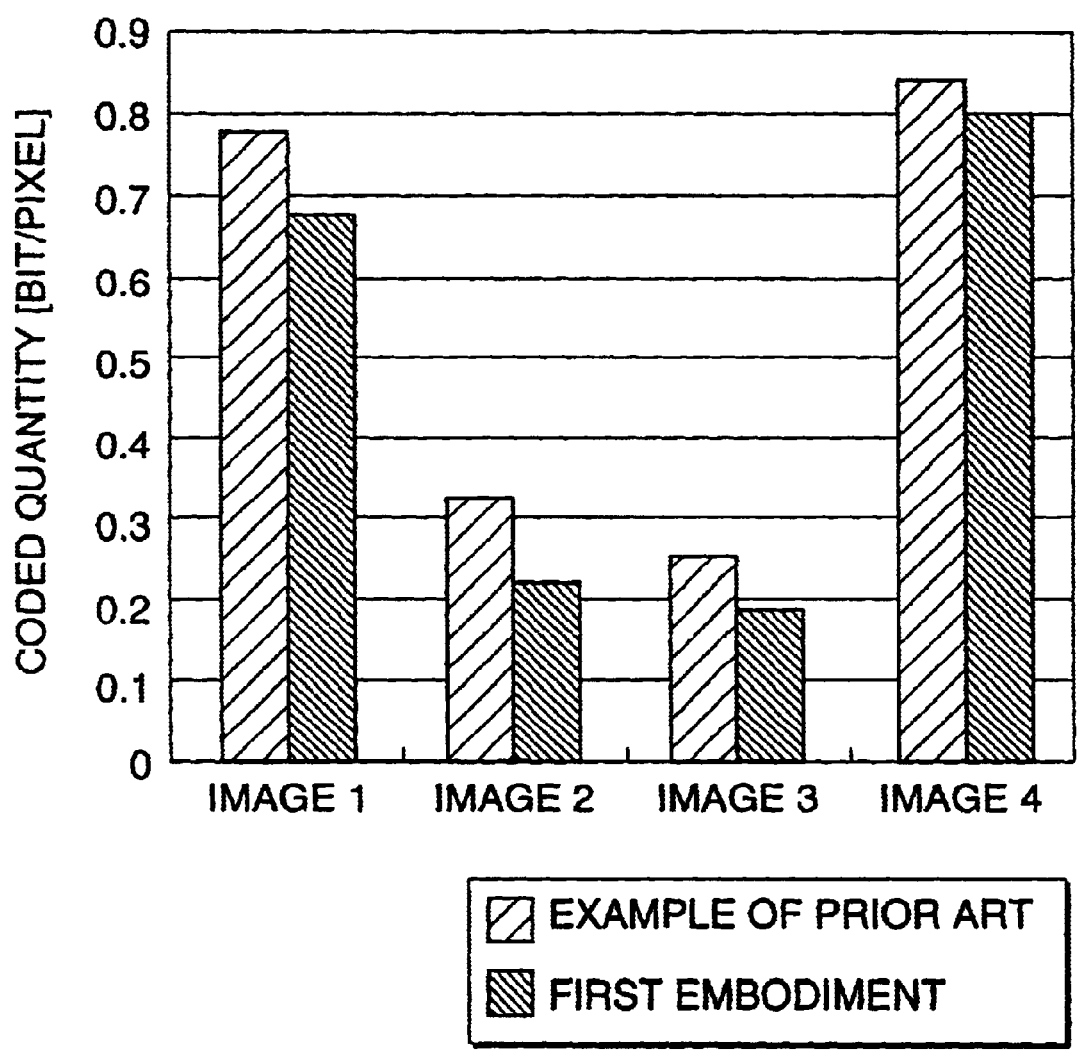
FIG. 9 is a graph showing the result of an experiment showing the effect of the first embodiment of the image coding/decoding device according to the present invention.

To verify the effect of this embodiment, experiments in coding some images were made. FIG. 9 shows the result of the experiments. It is known that the quantity of codes of any image is decreased in this embodiment, compared with that in the conventional type. The effect of this embodiment is clear from FIG. 9.

As described above, according to this embodiment, since a predictor is selected so that the efficiency of compression in run length coding executed later is enhanced, the compression ratio of an output code can be improved.

Second Embodiment

For a second embodiment of the present invention, a case where individual coding is performed without counting runs in the present invention will be concretely described below. First, the principle of this embodiment will be described. If run length coder is not used, to determine the compression ratio is the entropy of the identification number of a predictor included in prediction result data 130, which is the object of coding. That is, as the frequency of each identification number is biased, higher compression ratio can be acquired. As a matter of fact, as selection in the first embodiment is executed to continue the same identification number, it is substantially similar to reducing conditional entropy when an identification number immediately before is regarded as a condition. Therefore, the first embodiment can be regarded as a special form of this embodiment.

To bias the frequency of an identification number, identification numbers, of which predictors frequently hit (hereinafter called the high frequency numbers), has only to be preferably selected. Generally, it is difficult to precisely know the high frequency numbers beforehand. However, as the frequency distribution of an identification number has a qualitative character, the high frequency numbers can be predicted to some extent. It is the first embodiment that regards the high frequency number as the identification number of a predictor used in a pixel immediately before and lets which predictor is the longest as a choice. And it is the conventional type that directly predicts an identification number based upon the history of processing.

In this embodiment, processing is classified into two phase. In first processing, the high frequency numbers are searched and in second processing, actual coding is performed. Hereby, a load of processing is increased, however, high compression ratio can be expected.

This embodiment will be concretely described below. FIG. 10 is a block diagram showing this embodiment. In FIG. 10, the same reference number is allocated to the similar part to that in FIG. 1 and the description is omitted. A reference number 45 denotes a high frequency number determiner and 115 denotes high frequency number data.

Each unit shown in FIG. 10 will be described below. The high frequency number determiner 45 compares image data 100 and predicted value data 110 in the first processing and counts the hit frequency of each predictor. As a result of counting, an identification number higher in the hit frequency is determined as a higher frequency number in order and the result is sent to a selector 40 as high frequency number data 115. If the plural predictors hit, the selector 40 preferably selects a predictor which is higher in the high frequency number data 115 and sends as prediction result data 130.

Figure 11:
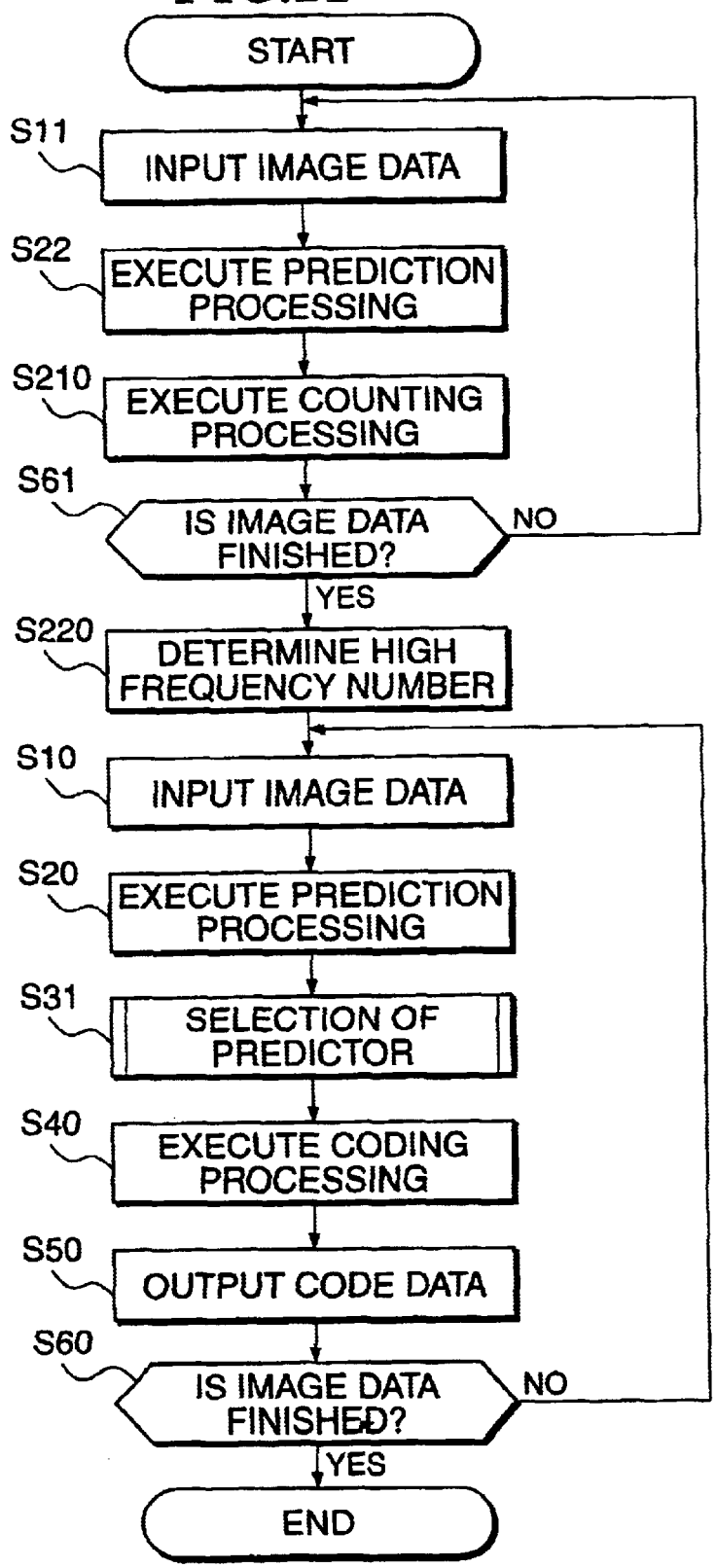
FIG. 11 is a flowchart showing an example of coding operation in the second embodiment of the image coding/decoding device according to the present invention.
Figure 12:
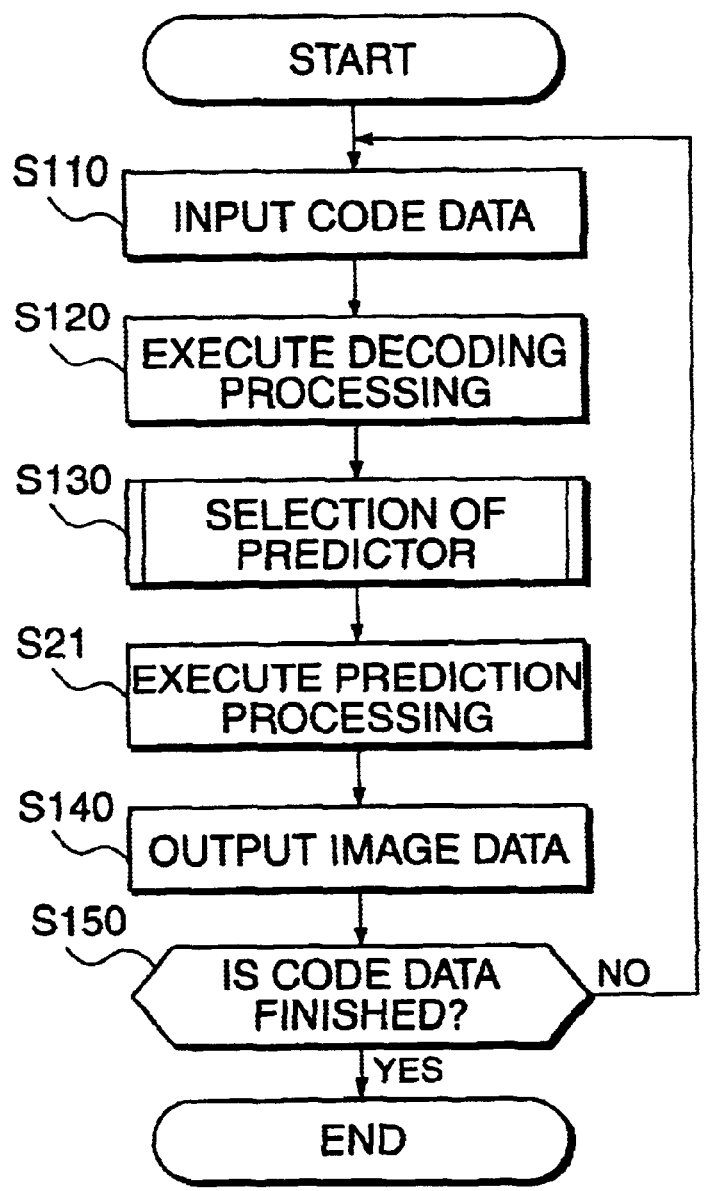
FIG. 12 is a flowchart showing an example of decoding operation in the second embodiment of the image coding/decoding device according to the present invention.
Figure 13:
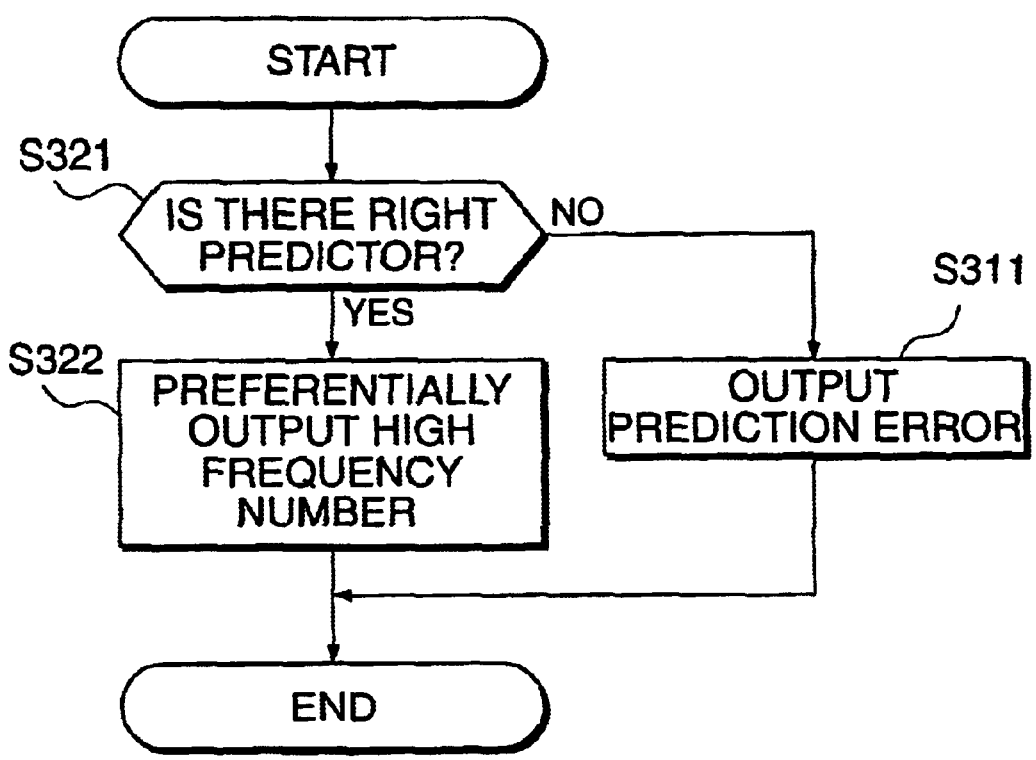
FIG. 13 is a flowchart showing an example of the details of the coding operation in the second embodiment of the image coding/decoding device according to the present invention.
Figure 14:
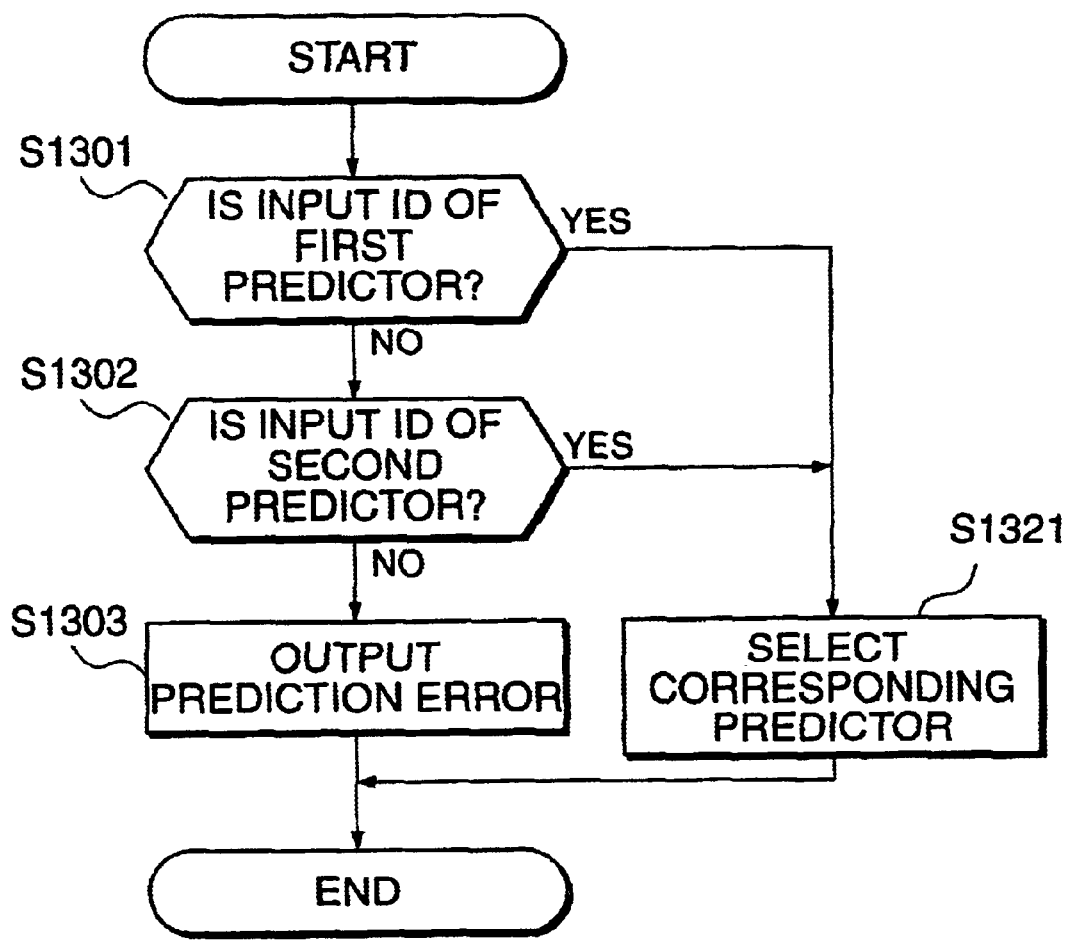
FIG. 14 is a flowchart showing an example of the details of the decoding operation in the second embodiment of the image coding/decoding device according to the present invention.

Referring to FIGS. 11 to 14 and others, the operation of the second embodiment will be described below based upon the above configuration. FIGS. 11 and 12 are flowcharts respectively showing coding operation and decoding operation in the second embodiment. FIGS. 13 and 14 are flowcharts showing the details of respective processing. In the above drawings, the same reference number is allocated to the similar part as that in FIGS. 17, 18, 2 and 3 and the description is omitted.

Referring to FIGS. 11 to 14, a processing procedure in the second embodiment will be described below. First, referring to FIG. 11, a processing procedure will be described. In S11, an image is input to an image input unit 10. In S22, the first predictor 20 and the second predictor 21 predict the value of a target pixel based upon image data 100 and simultaneously, a prediction error calculator 30 calculates an error of a predicted value according to a predetermined method. In S210, the high frequency number determiner 45 increments a hit frequency count value of a hit predictor by one. In S61, if the processing of image data input in S60 is finished, the processing proceeds to S220 and if not, the processing proceeds to S11. In S220, the high frequency number determiner 45 determines the identification numbers higher in the hit frequency and sends it to the selector 40 as high frequency number data 115.

Referring to FIG. 13, S31 will be described below. In S321, the selector 40 determines whether one or more hit predictor exists or not. If such a hit predictor exists, the processing proceeds to S322 and if not, the processing proceeds to S311. In S322, the selector 40 preferably selects a predictor higher in the hit frequency from hit predictors based upon the high frequency number data 115 and sends it to an encoder 50 as prediction result data 130.

Next, referring to FIG. 12, a decoding procedure will be described, however, the description of the similar part (after S130) to that in the first embodiment is omitted and referring to FIG. 14, only S130 will be described below. In S1321, the selector 40 selects the corresponding predictor. The rest is similar to the first embodiment, the description is omitted.

Of the above operation, in FIG. 11, operation that the high frequency numbers are first acquired based upon the whole image data and afterward, coding is executed is shown, however, its unit may also be a partial image. For example, an image is divided into partial band images, and a loop from S11 to S61 and a loop from S10 to S60 may also be continuously processed every band. In an example of operation shown in FIG. 11, an image is required to be input twice, however, in this transformed example, as a partial image has only to be input twice, it is easy to store it.

Also, in FIG. 11, in S10, a procedure for inputting an image again is shown, however, actually, image input processing in S11 and S10 and pixel value estimating processing in S22 and S20 are the same. Therefore, the result of S22 is temporarily stored and processing in S31 may also be suddenly started skipping S10 and S20. As the above can be easily guessed, the description is omitted. Hereby, the scale of the device is increased, however, a load of processing is reduced.

High frequency number data 115 shows the relationship between an identification number and the hit frequency. FIG. 15A shows an example of the format of the high frequency number data 115. In it, a predictor and its hit frequency are combined, however, if the relationship between a predictor and its hit frequency has only to be known, any format is acceptable. For example, high frequency number data may also be data in which predictors are sorted in the order of the hit frequency.

Also, a code used by the encoder 50 may also be designed using the high frequency number data 115. If the frequency distribution of each identification number is known beforehand, a more efficient code can be designed. FIG. 15B shows an example in which Huffman code which is well-known technique is designed. However, in this case, the frequency of prediction misses is also required to be counted.

The high frequency number data 115 may also include the hit frequency classified based upon a condition. The above condition denotes information which can be reproduced by a decoder, for example the value of an already processed pixel, the identification number of a predictor which hits and others. FIG. 15C shows an example using a condition that predictors hit or not at a pixel adjacent on the left. The entropy of an identification number can be further reduced by conditioning as described above. In this case, compression ratio can be enhanced by switching the high frequency numbers and a code table according to conditioning in S31 and S40 in FIG. 12. It can be also used for conditioning that a context in an international standard, a joint bi-level image experts group (JBIG) which is well-known technique (refer to pp. 59 to 61 of "International standard of multimedia coding" written by Mr. Yasuda and published by Maruzen in 1991). As this transformed example can be easily guessed, the description is omitted.

The high frequency number data 115 may also be the hit frequency of the combination of each predictor. If priority is given based upon comparison in the individual hit frequency, the order may be different from the suitable one. Referring to FIG. 15D, the above example will be described below. Suppose that three predictors are provided.

The total of the hit frequency of first, second and third predictors is respectively 221 times, 231 times and 58 times and the frequency becomes lower in the order of the second, the first and the third predictors. The entropy seems to decrease in the order of the second, the first and the third predictors. However, referring to a table showing combination, if the second predictor has first priority, the second predictor is selected in four cases (1) that the first, second and third predictors simultaneously hit, (2)that only the first and second predictors hit, (3)that only the second and third predictors hit and (4)that only the second predictor hits. Therefore the first and third predictors may be selected in a case other than the above four cases. To pay attention to only cases that the second predictor is wrong, there are three cases (5) that only the first and third predictors hit, (6) that only the first predictor hits and (7)that only the third predictor hits. To totalize the hit frequency of the first and third predictors in the above three cases, the respective frequency is 27 times and 33 times and they show that the hit frequency of the third predictor is higher than that of the first predictor. Therefore, in this case, suitable priority is the order of the second, it is known that the third and the first predictors. As described above, if an internal data format shown in FIG. 15D is defined, priority the entropy of which is less can be acquired.

As described above, according to this embodiment, as selection is enabled so that the entropy of an identification number is less, the compression ratio of an output code can be improved.

As clear from the above description, according to the present invention, image coding/decoding device having high compression efficiency particularly for a multivalued input image can be realized.

What is claimed is:

1. An image coding device, comprising:
an image input part that inputs an image;
plural pixel value predictors that predict a value of a target pixel to be coded in the image input by the image input part according to respective different prediction methods;
a prediction error calculator that calculates an error between the value of the target pixel in the image input by the image input part and the value predicted according to the predetermined prediction method;
a run counter that judges whether or not each pixel value predicted by the plural pixel value predictors and the value of the target pixel are coincident, and counts runs equivalent to a continuous length of the coincidences;
a selector that selectively outputs either identification information for identifying the pixel value predictor and a run length thereof or the error calculated by the prediction error calculator;
an encoder that encodes either the identification information and the run length or the error selectively output by the selector according to a predetermined method; and
an output part that outputs a code encoded by the encoder, wherein
when all the runs are terminated, if there is a run which continued till immediately before and whose length is at least one, the selector outputs the corresponding identification information and the run length thereof, and
all values counted by the run counter are initialized, and wherein
if there is at least one pixel value predictor in which the predicted value and the value of the target pixel are coincident at that time, the run counter newly starts counting, and if not, the selector outputs the error.

2. An image decoding device, comprising:
a code input part that inputs the code generated by the image coding device according to claim 1;
a decoder that decodes the code input by the code input part according to a predetermined method;
a selector that selects either a run executor or a prediction error adder based upon information decoded by the decoder;
the run executor that selects one of plural pixel value predictors by a frequency equivalent to run length based upon the identification information of the pixel value estimator according to claim 1 and the run length thereof decoded by the decoder;
the plural pixel value predictors that predict the value of a target pixel to be decoded in the image according to respective different prediction methods;
the prediction error adder that calculates the value of the target pixel in the image by adding an error decoded by the decoder to a value predicted according to the predetermined prediction method; and
an image output part that, if the selector selects the run executor and the run executor selects any of the pixel value predictors, outputs the value of the target pixel calculated by the selected pixel value predictor, and if the selector selects the prediction error adder, outputs the value of the target pixel calculated by the prediction error adder.

3. An image coding/decoding device, comprising:
the image coding device according to claim 1; and the image decoding device according to claim 2.

4. The image coding device according to claim 1, wherein if there are plural pixel value predictors having the longest run counted by the run counter, the predictor is selected based upon fixed or adaptive priority based upon statistical processing.

5. The image coding device according to claim 1, wherein when at least one run counted by the run counter reaches a preset upper limit value, output is performed before the run is terminated.

6. The image coding device according to claim 1, wherein both or either of pixel value prediction processing by the pixel value predictor and/or run counting processing by the run counter are/is executed in parallel.

7. The image coding device according to claim 1, wherein the run counter comprises a counter that stores a count value for every pixel value predictor and a run continuation flag showing runs continue.

8. The image coding device according to claim 1, further comprising:
a predictor priority determiner that allocates priority to the plural pixel value predictors based upon the history showing prediction hit of the plural pixel value predictors, wherein
the run counter outputs the priority, which is allocated by the predictor priority determiner, of the pixel value predictor as the identification information, and
the run executor selects the pixel value predictor based upon the identification information of the priority allocated by the predictor priority determiner.

9. The image coding device according to claim 8, wherein the priority of the predictors determined by the predictor priority determiner is determined based upon all or any of a frequency of the prediction hits, an absolute value of the prediction error, a mean or variance of the square of the prediction error and an interval from a final prediction hit.

10. The image coding device according to claim 8, wherein
the predictor priority determiner is provided with a function for temporarily converting the priority of the predictors, and
when priorities having no possibility of next output are known beforehand, those priorities are excluded from the determination of the priority of the predictors.

11. An image coding device, comprising:
an image input part that inputs an image;
plural pixel value predictors that predict a value of a target pixel to be coded in the image input by the image input part according to respective different prediction methods;
a prediction error calculator that calculates an error between the value of the target pixel in the image input by the image input part and the value predicted according to the predetermined prediction method;
a high frequency number determiner that judges whether or not each pixel value predicted by the plural pixel value predictors and the value of the target pixel are coincident and counts the frequency of the coincidences;
a selector that judges whether or not each pixel value predicted by the plural pixel value predictors and the value of the target pixel are coincident and selectively outputs, if they are coincident, identification information for identifying the pixel value predictor, or, if they are not coincident, the error calculated by the prediction error calculator;
an encoder that encodes the identification information or the error selectively output by the selector according to a predetermined method; and
an output part that outputs a code encoded by the encoder, wherein
the high frequency number determiner obtains high frequency number information including a frequency of the prediction hits as first processing, and
the selector identifies and selects the pixel value predictor based on the high frequency number information as second processing.

12. The image coding device according to claim 11, wherein
the image input by the image input part is divided into partial images, and
the first processing and the second processing are executed for every partial image.

13. The image coding device according to claim 11, further comprising:
a prediction result buffer that temporarily stores the result of prediction by the pixel value predictor, wherein
the selection processing by the selector is executed based upon the result of the prediction stored in the prediction result buffer.

14. The image coding device according to claim 11, wherein
the high frequency number information output by the high frequency number determiner is either a set of predictor identification information and the frequency of the prediction hit or the predictor identification information sorted in the order of the frequency of the prediction hit.

15. The image coding device according to claim 11, wherein
a code used in the encoder is designed based upon the high frequency number information output by the high frequency number determiner.

16. The image coding device according to claim 11, wherein the high frequency number information determined by the high frequency number determiner is calculated based upon the frequency of the prediction hit classified based upon information which can be reproduced by a decoder, wherein the information which can be reproduced by a decoder is at least one of the value of an already processed pixel, the identification information of the predictor which has correctly predicted and the identification information of the used predictor.

17. The image coding device according to claim 11, wherein
the high frequency number information determined by the high frequency number determiner is based upon the frequency of combinations of hit or miss in prediction by each predictor.

18. An image coding method, comprising the steps of:
inputting an image;
predicting a value of a target pixel to be coded in the image according to plural different prediction methods;
judging whether or not each value predicted by the plural pixel value predictors and the value of the target pixel are coincident;
counting, if the coincidence continues, runs which are continuous lengths of the coincidences for every prediction method, and terminating the runs if the coincidence does not continue;
when the runs of all pixel value predictors are terminated, if the length of the longest run, that continued till immediately before the termination of the run, is at least one, coding the run length and identification information for identifying the predictor;

initializing count values acquired by counting the runs; and newly starting the counting runs, if the value predicted by at least one pixel value predictor and the value of the target pixel are coincident, and coding an error between the value of the target pixel and the value predicted according to the predetermined prediction method if the values are not coincident.

* * * * *